(12) United States Patent
Lee et al.

(10) Patent No.: US 7,165,206 B2
(45) Date of Patent: Jan. 16, 2007

(54) SRAM-COMPATIBLE MEMORY FOR CORRECTING INVALID OUTPUT DATA USING PARITY AND METHOD OF DRIVING THE SAME

(75) Inventors: Sun Hyoung Lee, Seoul (KR); In Sun Yoo, Icheon-si (KR); Dong Woo Shin, Icheon-si (KR)

(73) Assignee: Silicon7 Inc. (KR)

( * ) Notice: Subject to any disclaimer, the term of this patent is extended or adjusted under 35 U.S.C. 154(b) by 457 days.

(21) Appl. No.: 10/659,115

(22) Filed: Sep. 10, 2003

(65) Prior Publication Data

US 2004/0066676 A1    Apr. 8, 2004

(30) Foreign Application Priority Data

Sep. 26, 2002    (KR) .................... 10-2002-0058342

(51) Int. Cl.
*G11C 29/00* (2006.01)
(52) U.S. Cl. .................................................. 714/763
(58) Field of Classification Search ......... 714/763–768
See application file for complete search history.

(56) References Cited

U.S. PATENT DOCUMENTS 4,710,934 A    12/1987    Traynor .................... 371/38

2002/0121886 A1 *    9/2002    Shau .................... 323/281
2003/0086306 A1 *    5/2003    Takahashi et al. .......... 365/200
2003/0093744 A1 *    5/2003    Leung et al. ............... 714/763
2005/0044467 A1 *    2/2005    Leung et al. ............... 714/763

FOREIGN PATENT DOCUMENTS

EP        0 238 417        9/1987

* cited by examiner

*Primary Examiner*—Albert Decady
*Assistant Examiner*—Sam Rizk
(74) *Attorney, Agent, or Firm*—Cantor Colburn LLP

(57) ABSTRACT

Disclosed herein is an SRAM-compatible memory for correcting invalid output data using parity and a method of driving the same. In the SRAM-compatible memory, input data and a parity value obtained from the input data are written in data banks and parity bank, respectively. When invalid data is output from a specific memory bank due to the performance of a refresh operation or other factors, the invalid data are corrected by a data corrector using the parity value written in the parity bank, thus generating output data having the same logic value as the input data. The SRAM-compatible memory prevents a reduction in operation speed due to an internal operation, such as a refresh operation.

15 Claims, 4 Drawing Sheets

SRAM-COMPATIBLE MEMORY FOR CORRECTING INVALID OUTPUT DATA USING PARITY AND METHOD OF DRIVING THE SAME

BACKGROUND OF THE INVENTION

1. Field of the Invention

The present invention relates to semiconductor memory devices, and more particularly to a memory device compatible with a static random access memory, which employs dynamic random access memory cells.

2. Description of the Related Art

Generally, random access memory (RAM) devices are classified into static RAM (SRAM) devices and dynamic RAM (DRAM) devices. A RAM device generally includes a memory array composed of a plurality of unit memory cells arranged in a matrix form defined by rows and columns, and peripheral circuits used to control the input/output of data to/from the unit memory cells. Each of the unit memory cells stores one bit of data. In an SRAM, each unit memory cell is implemented using four transistors that form a latch structure and two transistors that act as transmission gates. Since SRAM devices store data in unit memory cells having latch structures, no refresh operation is required to maintain the stored data. Further, the SRAM devices have the advantages of a fast operating speed and low power consumption compared to DRAM devices.

However, since each unit memory cell of an SRAM is composed of six transistors, the SRAM is disadvantageous in that it requires a large wafer area compared to a DRAM that generally has unit memory cells each implemented using a transistor and a capacitor. In more detail, in order to manufacture a semiconductor memory device of the same capacity, the SRAM requires a wafer about six to ten times larger than that of the DRAM. The necessity of such a large wafer increases the unit cost of the SRAM. When a DRAM instead of an SRAM is used to reduce the cost, a DRAM controller is additionally required to perform a periodic refresh operation. Further, the entire performance of a system deteriorates due to the time required to perform the refresh operation and a slow operating speed.

In order to overcome the disadvantages of the DRAM and the SRAM, attempts have been made to implement an SRAM to which DRAM memory cells are applied. One of these attempts is the technology of effectively concealing a refresh operation from the outside of the memory to enable the memory to be compatible with the SRAM.

In a read-access operation based on the conventional SRAM-compatible technology, an additional time period is required for internal refresh operation within a read-access interval, or read-access timing is delayed in order to obtain a time required to refresh DRAM cells of a memory array.

However, such a conventional synchronous SRAM-compatible memory is problematic in that the memory read-access timing is internally delayed, and an overall read operating speed is decreased due to the delay of the access timing.

SUMMARY OF THE INVENTION

The above-discussed and other problems and deficiencies occurring in the prior art are overcome or alleviated by an SRAM-compatible memory and method of driving the same, which is compatible with an SRAM and employs DRAM memory cells, and also prevents operation speed from decreasing due to a refresh operation.

The present invention provides an SRAM-compatible memory including a plurality of memory banks each having a plurality of DRAM cells arranged in a matrix form defined by rows and columns. The DRAM cells require a refresh operation within a predetermined refresh period to allow data stored therein to remain valid, and are capable of interfacing with an external system which does not provide a separate operation timing period for performing the refresh operation for the DRAM cells. The SRAM-compatible memory comprises the memory banks for receiving and storing the input data externally provided, in which the memory banks generate bank information signals each indicating whether a corresponding memory bank is subjected to an invalid read-access; a parity generator for receiving the input data to generate input parity that is determined from the input data and a preset parity value; a parity bank for storing the input parity and generating a parity information signal indicating whether the parity bank is subjected to the invalid read-access; and a data corrector for receiving the bank information signals and fetched data from the memory banks and generating output data having the same value as the input data by correcting data fetched from a memory bank subjected to the invalid read-access if a checked parity value is different from the preset parity value. The checked parity value is obtained using the fetched data provided from the memory banks and parity data fetched from the parity bank.

Further, the present invention provides a method of driving the above-described SRAM-compatible memory. The method of driving the SRAM-compatible memory comprises the steps of providing input data to the memory banks; obtaining input parity from a preset parity value and the input data; writing the input data in the memory banks and the input parity in a parity bank; fetching data from the memory banks in response to a read command; providing bank information indicating that any of the memory banks is subjected to an invalid read-access; obtaining a checked parity value from the fetched data and parity data fetched from the parity bank; and correcting data fetched from the memory bank subjected to the invalid read-access if the checked parity value is different from the preset parity value.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
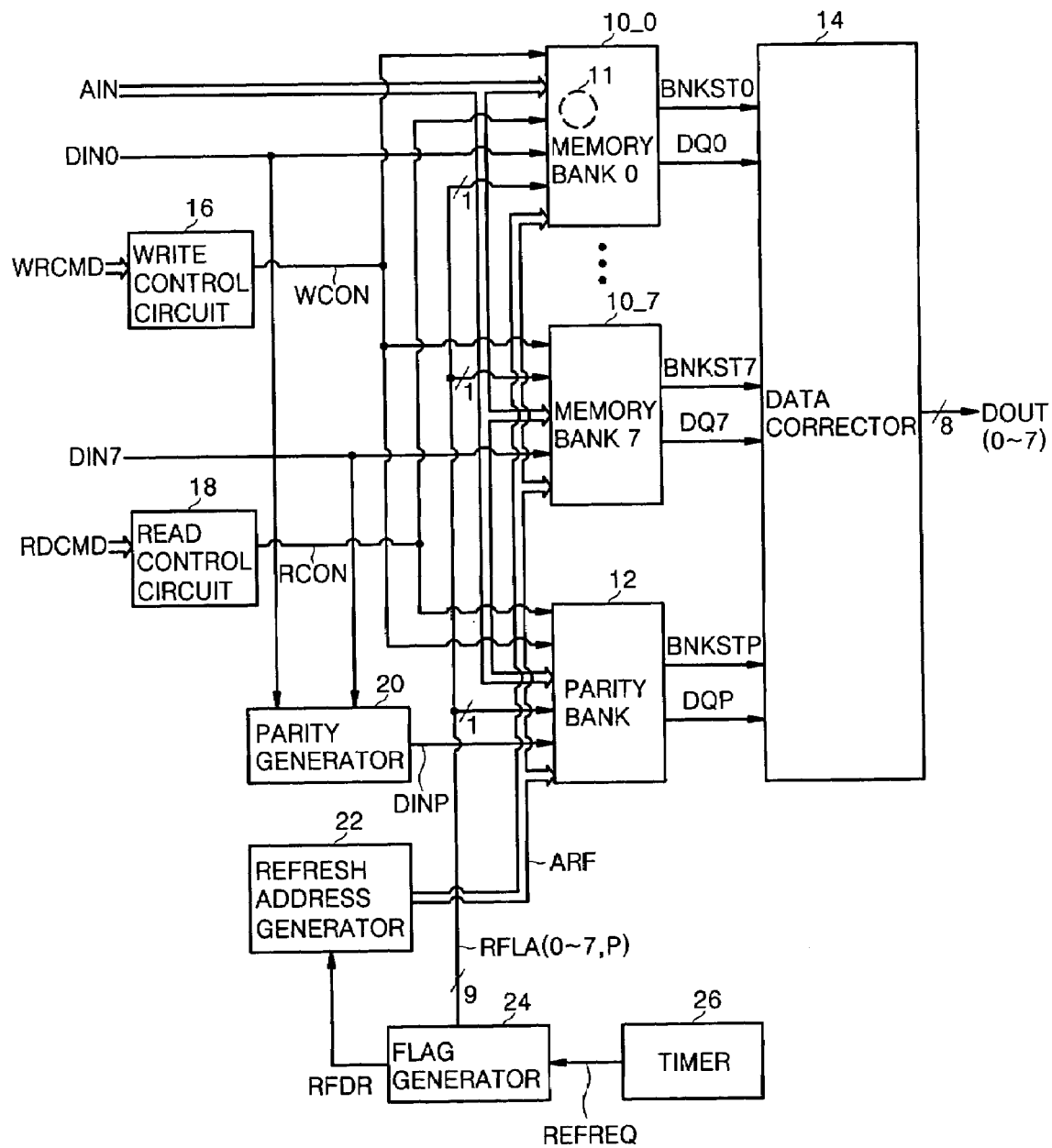
FIG. 1 is a block diagram illustrating an SRAM-compatible memory according to an embodiment of the present invention.

Reference now should be made to the drawings, in which the same reference numerals are used throughout the different drawings to designate the same or similar components.

An SRAM-compatible memory according to the present invention exploits DRAM cells and performs a refresh operation when seen from an internal standpoint, but does not allocate an operation period for the refresh operation when seen from an external standpoint. In other words, the refresh operation that is internally performed is not externally observable from the outside of the synchronous SRAM-compatible memory. Additionally, the SRAM-compatible memory does not require an external control signal for controlling a refresh operation, and can be operated according to the same rules as a general SRAM.

The SRAM-compatible memory of the present invention has a data input/output structure capable of simultaneously receiving multiple data to be stored in respective memory banks and simultaneously outputting the stored data. In this specification, data provided from an external system or another system to the SRAM-compatible memory of the present invention is referred to as "input data", and data provided from the SRAM-compatible memory of the present invention to an external system or another system is referred to as "output data".

FIG. 1 is a block diagram showing an SRAM-compatible memory according to an embodiment of the present invention. In this embodiment, for example, the SRAM-compatible memory simultaneously receives eight input data and simultaneously outputs eight data.

Referring to FIG. 1, the SRAM-compatible memory of the present invention includes eight memory banks $10\_i$(i=0 to 7), a parity bank 12 and a data corrector 14. Further, the SRAM-compatible memory of the present invention includes a write control circuit 16, a read control circuit 18, a parity generator 20, a refresh address generator 22, a flag generator 24 and a refresh timer 26.

Figure 2:
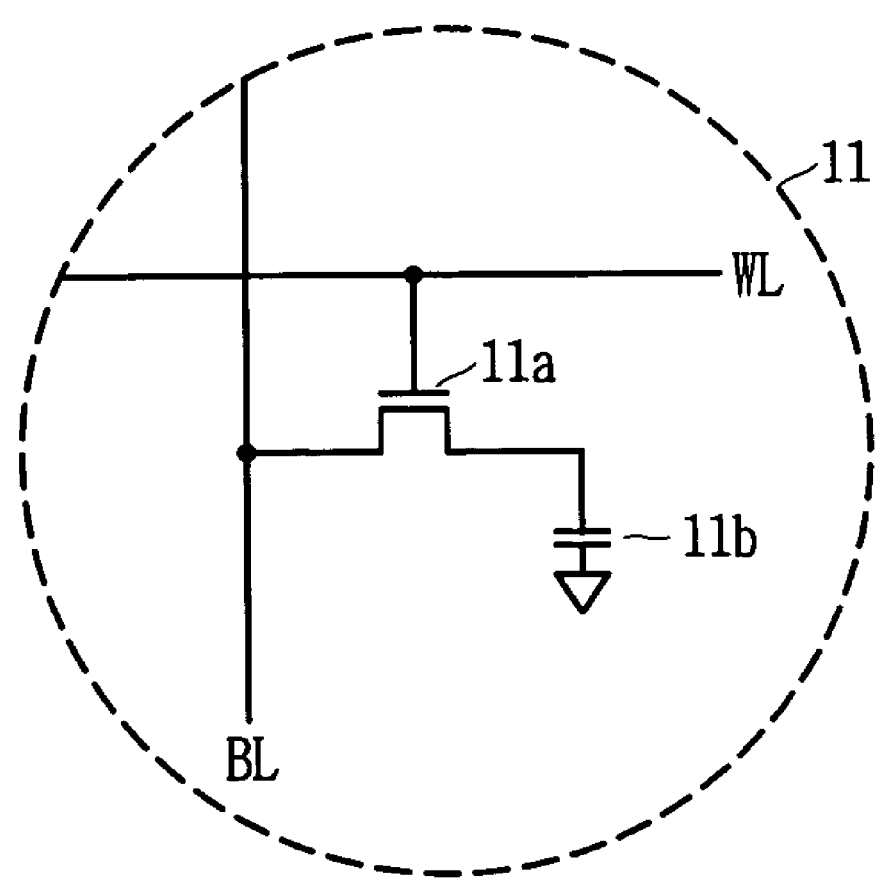
FIG. 2 is a diagram showing a memory cell included in the memory banks and the parity bank of FIG. 1.

Each of the eight memory banks $10\_i$(i=0 to 7) and the parity bank 12 includes memory cells 11 arranged in a matrix form defined by rows and columns. For example, the eight memory banks $10\_i$(i=0 to 7) and the parity bank 12 have the substantially same capacity and structure. For the memory cells 11, it is required to perform a refresh operation within a predetermined refresh period to maintain stored data therein. A typical example of such a memory cell 11 is a DRAM cell. For ease of description, the memory cells 11 will be referred to as "DRAM cells" in the present specification. Each DRAM cell, as shown in FIG. 2, is implemented using a transmission transistor $11a$ gated with a word line WL and a capacitor $11b$ to store data of a bit line BL transmitted through the transmission transistor $11a$.

Referring again to FIG. 1, the eight input data DIN0 to DIN7 are provided to the eight memory banks $10\_i$(i=0 to 7), respectively. The eight memory banks $10\_i$(i=0 to 7) write the eight input data DIN0 to DIN7, respectively, in DRAM cells 11 specified by an internal address signal AIN in response to a write control signal WCON. For the stored input data, as described above, a refresh operation is necessary to maintain the data written in the DRAM cells 11 valid. DRAM cells in a same location in the respective memory banks $10\_i$(i=0 to 7) have the same address, although the memory banks receive the different input data DIN0 to DIN7.

The input data DIN0 to DIN7 are written into the memory banks $10\_i$(i=0 to 7), respectively, independent of each other. Also, a read-access operation for outputting stored data is performed in the respective memory banks $10\_i$(i=0 to 7) independent of each other.

In the parity bank 12, input parity data DINP provided from the parity generator 20 is written in a specified DRAM cell of the parity bank 12 in response to the write control signal WCON. As those of the memory banks, DRAM cells of the parity bank 12 also necessitate a refresh operation in order for data stored therein to remain valid. The DRAM cell for storing the input parity DINP is specified by the same internal address signal AIN specifying the DRAM cells in the eight memory banks $10\_i$(i=0 to 7).

The memory banks $10\_i$(i=0 to 7) and the parity bank 12 enter a refresh operation state in response to respective refresh flag signals RFLAi (i=0 to 7, P) provided from the flag generator 24. In the refresh operation state, the memory banks $10\_i$(i=0 to 7) and the parity bank 12 refresh DRAM cells specified by a refresh address signal AR provided from the refresh address generator 22.

The write control circuit 16 receives a write command WRCMD to generate the write control signal WCON to the memory banks $10\_i$(i=0 to 7) and the parity bank 12.

The parity generator 20 receives the input data DIN0 to DIN7, and provides the input parity DINP. The input parity DINP represents a preset parity value associated with the input data DIN0 to DIN7. For example, when the preset parity value is "0 (even number)", the input parity DINP is "1" if an odd number of input data DIN0 to DIN7 have value "1". In like manner, the input parity DINP is "0" if even number of input data DIN0 to DIN7 have value "1". On the contrary, when the preset parity value is "1 (odd number)", the input parity DINP has a value opposite to the above results in case of the preset parity value "0".

The refresh timer 26 generates a refresh request signal REFREQ that is regularly activated at refresh periods. The flag generator 24 generates a refresh drive signal RFDR activated in response to the refresh request signal REFREQ. Further, the flag generator 24 generates the nine refresh flag signals RFLAi (i=0 to 7, P), which are cyclically activated in response to the refresh request signal REFREQ. The refresh address generator 22 provides the refresh address signal ARF for varying an address to be specified to the eight memory banks $10\_i$(i=0 to 7) and the parity bank 12 in response to every ninth activation of the refresh drive signal RFDR.

Therefore, in the embodiment of the present invention, the DRAM cells of the eight memory banks $10\_i$(i=0 to 7) and the parity bank 12, connected to word lines of the same address, are sequentially refreshed. Further, the refresh address signal AR for specifying word lines to be refreshed varies in response to every ninth activation of the refresh drive signal RFDR.

Therefore, the memory banks $10\_i$(i=0 to 7) and the parity bank 12 sequentially perform the refresh operation. Consequently, a case where the refresh operation is simultaneously performed with respect to two banks does not occur.

Further, according to a modified embodiment of the present invention, the SRAM-compatible memory can be designed so that a refresh operation is performed with respect to all DRAM cells connected to word lines of a single memory bank, and then performed with respect to DRAM cells connected to word lines of another memory bank. Those skilled in the art may appreciate that this modified embodiment of the present invention is possible. Therefore, a detailed description of the modified embodiment relating to the refresh operation is omitted.

The memory banks $10\_i$(i=0 to 7) provide data DQi (i=0 to 7) (referred to as "fetched data" in the specification), fetched from DRAM cells specified by the internal address signal AIN, to the data corrector 14 in response to a read control signal RCON. Further, the parity bank 12 provides data DQP (referred to as "parity data" in the present specification), fetched from a DRAM cell specified by the internal address signal AIN, to the data corrector 14 in response to the read control signal RCON.

The memory banks 10_i(i=0 to 7) also generate bank information signals BNKSTi (i=0 to 7), respectively. Further, the parity bank 12 generates a parity information signal BNKSTP. In this embodiment, if a read command is generated during a refresh operation period so that data stored in the DRAM cells cannot be read, or if a read command for specifying DRAM cells is issued before the input data are written in the DRAM cells, the bank information signals BNKSTi (i=0 to 7) and the parity information signal BNKSTP indicate that read-access for a corresponding memory bank having the DRAM cells is invalid.

For example, when the memory banks 10_i(i=0 to 7) are subjected to the invalid read-access, they respectively output the bank information signals BNKSTi (i=0 to 7) each having logic value "1". Also, in the case where the input parity DINP stored (or to be stored) in a specified DRAM cell of the parity bank 12 is invalidly accessed to be read, the parity information signal BNKSTP becomes logic value "1".

The data corrector 14 receives fetched data DQi (i=0 to 7) and the parity data DQP provided from the memory banks 10_i(i=0 to 7) and the parity bank 12, respectively, and obtains checked parity which indicates that, of the fetched data DQi (i=0 to 7) and parity data DQP, the total number of data having logic value "1" is odd or even.

Further, the data corrector 14 recognizes the memory banks 10_i(i=0 to 7) and/or the parity bank 12 from which invalid data is fetched due to the invalid read access, by receiving the bank information signals BNKSTi (i=0 to 7) and the parity information signal BNKSTP. The data corrector 14 corrects data fetched from an invalidly read-accessed memory bank if the checked parity value and the preset parity value are different.

Further, the read control circuit 18 receives an externally applied read command RDCMD, and provides the read control signal RCON to the memory banks 10_i(i=0 to 7) and the parity bank 12, thereby controlling the data read operation.

Figure 3:
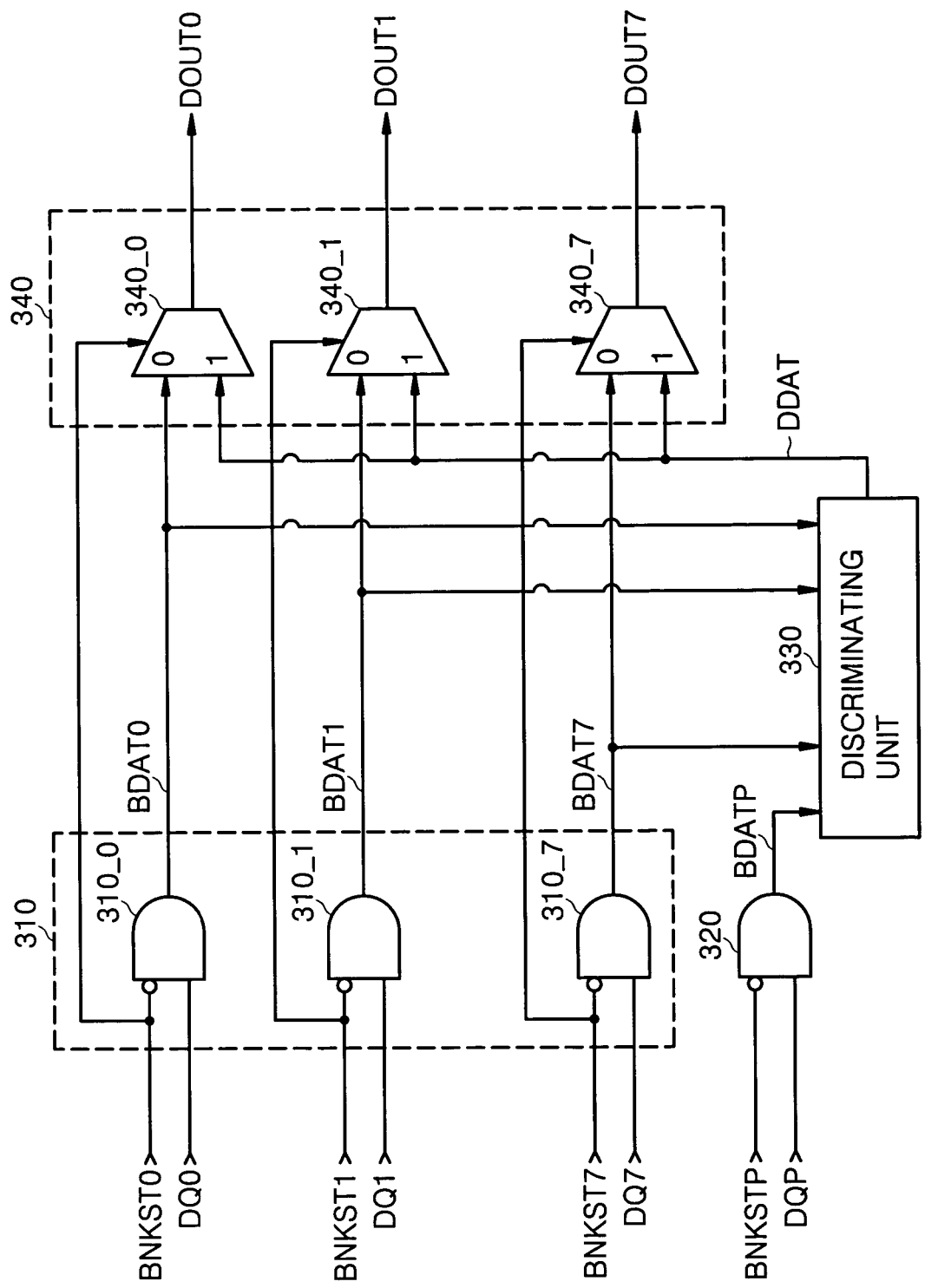
FIG. 3 is a detailed circuit diagram showing the data corrector of FIG. 1.

FIG. 3 is a detailed circuit diagram showing the data corrector 14 of FIG. 1 according an exemplary embodiment of the present invention. Referring to FIG. 3, the data corrector 14 includes a bank data control unit 310, a parity data control unit 320, a discriminating unit 330 and a selecting unit 340. The bank data control unit 310 includes, for example, eight first logic devices 310_i(i=0 to 7). The first logic devices 310_i(i=0 to 7) each perform logic AND operation with respect to an inverted signal of corresponding one of the bank information signals BNKSTi (i=0 to 7) and corresponding one of the fetched data DQi (i=0 to 7) provided from the memory banks 10_i(i=0 to 7) and output bank control data BDATi (i=0 to 7) each from corresponding one of the first logic devices 310_i(i=0 to 7).

Of the bank control data BDATi (i=0 to 7), ones output from the first logic devices receiving the bank information signals that do not indicate the invalid read-access have the same logic values as the output data DQi (i=0 to 7) provided to the first logic devices. However, the bank control data BDATi (i=0 to 7) output from the first logic devices receiving the bank information signals indicating the invalid read-access in the corresponding memory banks have logic value "0" (referred to as "first logic value" in this specification) independent of the fetched data DQi (i=0 to 7) provided to the first logic devices.

The parity data control unit 320 receives the parity data DQP and the parity information signal BNKSTP fetched from the parity bank 12 and provides parity control data BDATP. The parity data control unit 320 that may be configured with logic devices, is in this embodiment implemented with a second logic device 320 which performs logic AND operation with respect to an inverted signal of the parity information signal BNKSTP and the parity data DQP provided from the parity bank 12, and outputs the parity control data BDATP.

Therefore, when the parity bank 12 is subjected to the invalid read-access due to the performance of a refresh operation or other factors, the parity control data BDATP becomes logic value "0" independent of logic value of the parity data DQP. On the contrary, when the data stored in the parity bank 12 is validly fetched, the parity control data BDATP has the same logic value as the parity data DQP.

The discriminating unit 330 provides discrimination data DDAT having a logic value determined based on the number of data having logic value "1" among the bank control data BDATi (i=0 to 7) and the parity control data BDATP. That is, when checked parity data obtained from the bank control data BDATi (i=0 to 7) and the parity control data BDATP is different from preset parity data, the discrimination data DDAT has logic value "1" (referred to as "second logic value" in this specification).

The discrimination data DDAT is provided to the selecting unit 340. The selecting unit 340 includes a plurality of multiplexers 340_i(i=0 to 7). The multiplexers 340_i(i=0 to 7) respectively receive the bank control data BDATi (i=0 to 7) and the discrimination data DDAT. For example, each of the multiplexers 340_i(i=0 to 7) has first and second input terminals to which a corresponding bank control data and the discrimination data are provided, respectively. Further, the multiplexers 340_i(i=0 to 7) respectively select one of the bank control data BDATi (i=0 to 7) and the discrimination data DDAT in response to the bank information signals BNKSTi (i=0 to 7) to generate the output data DOUTi (i=0 to 7). As a result, a multiplexer 340_i(i=0 to 7) associated with a memory bank 10_i(i=0 to 7) that is subjected to the invalid read-access, selects the discrimination data DDAT as the output data DOUTi (i=0 to 7). In contrast, a multiplexer 340_i (i=0 to 7) associated with a memory bank 10_i(i=0 to 7) which provides validly fetched data, selects the bank control data BDATi (i=0 to 7) as output data DOUTi (i=0 to 7).

Figure 4:
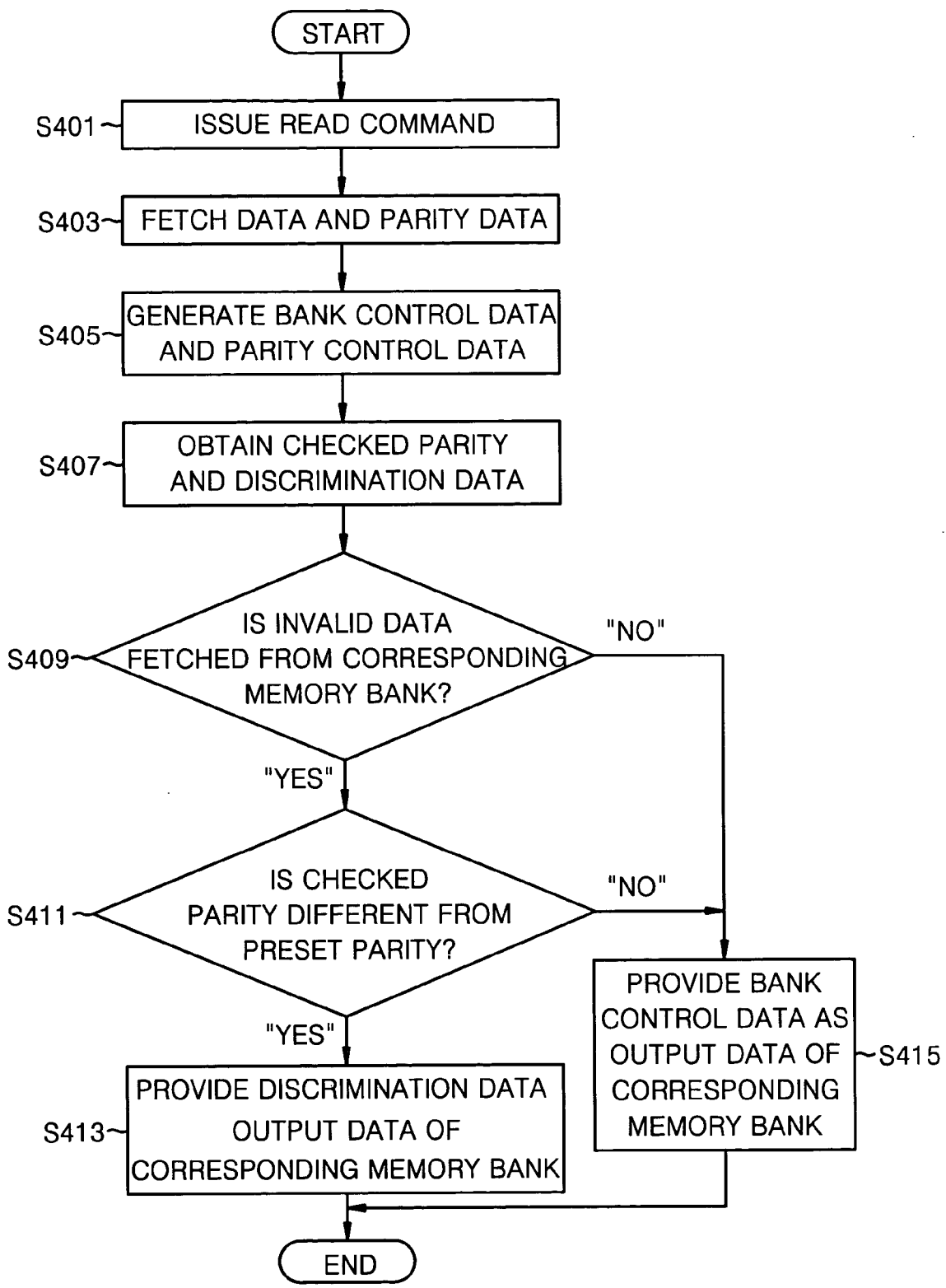
FIG. 4 is a flowchart describing a read operation of the SRAM-compatible memory according to the embodiment of the present invention.

FIG. 4 is a flowchart for describing a read operation of the SRAM-compatible memory according to the embodiment of the present invention. Referring to FIG. 4, when the read command RDCMD is issued at step S401, data written in specified DRAM cells of the memory banks 10_i(i=0 to 7) are provided as fetched data DQi (i=0 to 7), and data written in a specified DRAM cell of the parity bank 12 is fetched as the parity data DQP at step S403. The fetched data DQi (i=0 to 7) and the parity data DQP are used to obtain the bank control data BDATi (i=0 to 7) and the parity control data BDATP, respectively, at step S405. At this time, bank control data BDATi (i=0 to 7) associated with a memory bank 10_i(i=0 to 7) that has been subjected to the invalid read-access, has logic value "0".

Checked parity and discrimination data DDAT are obtained using the fetched data DQi (i=0 to 7) and the parity data DQP at step S407. Further, it is determined whether fetched data is invalid due to the invalid read-access performed to a specified DRAM cell of a corresponding memory bank 10_i(i=0 to 7) at step S409. If the fetched data is determined invalid, it is next determined whether the checked parity is different from the preset parity at step S411. If the checked parity is different from the preset parity, the discrimination data DDAT is generated as the output data DOUTi (i=0 to 7) of the corresponding memory banks 10_i(i=0 to 7).

On the contrary, if data is validly fetched from the DRAM cell of the corresponding memory bank $10\_i(i=0$ to $7)$, or if the checked parity is the same as the preset parity, the bank control data BDATi (i=0 to 7) is generated as the output data DOUTi (i=0 to 7) of the corresponding memory bank $10\_i(i=0$ to $7)$.

A detail description follows of an exemplary operation of the SRAM-compatible memory of the present invention. In this example, a preset parity value is assumed to be "0 (even number)". Further, it is assumed that the input data DIN0 to DIN7 have logic values shown in Table 1, respectively.

TABLE 1

|  | Input data | | | | | | | |
| --- | --- | --- | --- | --- | --- | --- | --- | --- |
|  | DIN0 | DIN1 | DIN2 | DIN3 | DIN4 | DIN5 | DIN6 | DIN7 |
| Logic value | 1 | 1 | 1 | 0 | 0 | 0 | 0 | 0 |

In the input data DIN0 to DIN7, the number of data having logic value "1" is "3". Thus, the input parity DINP becomes "1". The input parity DINP is then written into a specified DRAM cell of the parity bank 12. Also, the input data DIN0 to DIN7 are provided to the memory banks $10\_i(i=0$ to $7)$, respectively.

Lets assume that a read command is issued when a refresh operation is performed with respect to the DRAM cells in the first memory bank 10_0 (i.e., the first memory bank is subjected to the invalid read-access). In this case, when the fetched data DQ1 to DQ7 are provided from DRAM cells of the respective memory banks $10\_i$ (i=0 to 7) addressed by the internal address signal AIN, the fetched data DQ0 is not valid data provided from a DRAM cell of the first memory bank 10_0. As a result, the fetched data DQi(i=0 to 7) output from the respective memory banks $10\_i(i=0$ to $7)$ and the parity data DQP have logic values shown in Table 2.

TABLE 2

|  | Data | | | | | | | | |
| --- | --- | --- | --- | --- | --- | --- | --- | --- | --- |
|  | DQ0 | DQ1 | DQ2 | DQ3 | DQ4 | DQ5 | DQ6 | DQ7 | DQP |
| Logic value | Invalid | 1 | 1 | 0 | 0 | 0 | 0 | 0 | 1 |

In this case, the bank information signals BNKSTi (i=0 to 7) of the respective memory banks $10\_i(i=0$ to $7)$ and the parity information signal BNKSTP of the parity bank 12 have logic values shown in Table 3.

TABLE 3

|  | Information signal | | | | | | | | |
| --- | --- | --- | --- | --- | --- | --- | --- | --- | --- |
|  | BNK ST0 | BNK ST1 | BNK ST2 | BNK ST3 | BNK ST4 | BNK ST5 | BNK ST6 | BNK ST7 | BNK STP |
| Logic value | 1 | 0 | 0 | 0 | 0 | 0 | 0 | 0 | 0 |

Therefore, the bank control data BDATi (i=0 to 7) corresponding to the memory banks $10\_i(i=0$ to $7)$ and the parity control data BDATP corresponding to the parity bank 12 have logic values shown in Table 4.

TABLE 4

|  | Control data | | | | | | | | |
| --- | --- | --- | --- | --- | --- | --- | --- | --- | --- |
|  | BDAT 0 | BDAT 1 | BDAT 2 | BDAT 3 | BDAT 4 | BDAT 5 | BDAT 6 | BDAT 7 | BDAT P |
| Logic value | 0 | 1 | 1 | 0 | 0 | 0 | 0 | 0 | 1 |

Therefore, in the bank control data BDATi (i=0 to 7) and the parity control data BDATP, the parity (referred to as "checked parity" in this specification) of the data having logic value "1" is "1". Therefore, since the checked parity is different from the preset parity having logical value "0", the discrimination data DDAT provided from the discriminating unit 330 has logical value "1".

As described above, the output data DOUTi (i=0 to 7) corresponding to the memory banks $10\_i(i=0$ to $7)$ have logic values shown in Table 5.

TABLE 5

|  | Output data | | | | | | | |
| --- | --- | --- | --- | --- | --- | --- | --- | --- |
|  | DOUT 0 | DOUT 1 | DOUT 2 | DOUT 3 | DOUT 4 | DOUT 5 | DOUT 6 | DOUT 7 |
| Logical value | 1 | 1 | 1 | 0 | 0 | 0 | 0 | 0 |

Therefore, the output data DOUTi (i=0 to 7) have the same logic values as the input data DINi (i=0 to 7), respectively.

In case that a refresh operation is performed with respect to the parity bank 12 at the same time the read command is issued, the fetched data DQi (i=0 to 7) are all validly provided from the memory banks 10_i(i=0 to 7). Therefore, the bank control data BDATi (i=0 to 7) are provided as the output data DOUTi (i=0 to 7) independent of the checked parity.

In accordance with the SRAM-compatible memory according to the present invention, a parity value for input data is written in a parity bank. Further, invalidly is fetched data are corrected to be valid using the parity value written in the parity bank. That is, even though there is a memory bank from which data is invalidly fetched due to a refresh operation or other factors performed at the same time of the read operation, the invalid fetched data are corrected by a data corrector, thus generating output data having the same logic values as input data. Therefore, the SRAM-compatible memory of the present invention is advantageous in that it can prevent a reduction in read operation speed due to the refresh operation.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An SRAM-compatible memory including a plurality of memory banks each having a plurality of DRAM cells arranged in a matrix form defined by rows and columns, the DRAM cells interfacing with an external system which does not provide a separate timing period for performing a refresh operation for the DRAM cells, comprising:

the memory banks for receiving and storing input data externally provided, the memory banks generating bank information signals each indicating whether a corresponding memory bank is subjected to an invalid read-access;

a parity generator for receiving the input data to generate input parity, the input parity being determined based on the input data and a preset parity value;

a parity bank for storing the input parity and generating a parity bank information signal indicating whether the parity bank is subjected to the invalid read-access;

a refresher timer generating a refresh request signal periodically to activate the refresh operation for both the memory banks and the parity bank; and a data corrector receiving the bank information signals and fetched data from the memory banks and generating output data having same value as the input data by correcting data fetched from a memory bank subjected to the invalid read-access if a checked parity value is different from the preset parity value, the checked parity value being obtained using the fetched data provided from the memory banks and parity data fetched from the parity bank, wherein the data corrector comprises:

a bank data control unit for receiving the bank information signals and the fetched data to provide bank control data, any of the bank control data corresponding to fetched data provided from any of the memory banks subjected to the invalid read-access has a first logic value;

a parity data control unit for receiving the parity information signal and the parity data fetched from the parity bank to provide parity control data;

a discriminating unit for receiving the bank control data and the parity control data and providing discrimination data having a second logic value contrary to the first logical value if the fetched parity data is different from the input parity; and a selecting unit for selecting the bank control data or the discrimination data in response to the bank information signals to generate the output data, wherein the refresh operation is independently performed with respect to the respective memory banks, and is prevented from being simultaneously performed with respect to two or more memory banks.

2. The SRAM-compatible memory according to claim 1, wherein the parity bank has a substantially same capacity and structure as each of the memory banks.

3. The SRAM-compatible memory according to claim 1, wherein the memory banks each independently store corresponding one of the input data.

4. The SRAM-compatible memory according to claim 1, wherein each of the memory banks independently performs a read-access operation in response to a read command externally provided.

5. An SRAM-compatible memory including a plurality of memory banks each having a plurality of DRAM cells arranged in a matrix form defined by rows and columns, the DRAM cells interfacing with an external system which does not provide a separate timing period for performing a refresh operation for the DRAM cells, comprising:

the memory banks for receiving and storing input data externally provided, the memory banks generating bank information signals each indicating whether a corresponding memory bank is subjected to an invalid read-access;

a parity generator for receiving the input data to generate input parity, the input parity being determined based on the input data and a preset parity value;

a parity bank for storing the input parity and generating a parity bank information signal indicating whether the parity bank is subjected to the invalid read-access;

a refresher timer generating a refresh request signal periodically to activate the refresh operation for both the memory banks and the parity bank; and a data corrector receiving the bank information signals and fetched data from the memory banks and generating output data having same value as the input data by correcting data fetched from a memory bank subjected to the invalid read-access if a checked parity value is different from the preset parity value, the checked parity value being obtained using the fetched data provided from the memory banks and parity data fetched from the parity bank, wherein the data corrector comprises:

a bank data control unit for receiving the bank information signals and the fetched data to provide bank control data, any of the bank control data corresponding to fetched data provided from any of the memory banks subjected to the invalid read-access has a first logic value;

a parity data control unit for receiving the parity information signal and the parity data fetched from the parity bank to provide parity control data;

a discriminating unit for receiving the bank control data and the parity control data and providing discrimination data having a second logic value contrary to the first logical value if the fetched parity data is different from the input parity; and a selecting unit for selecting the bank control data or the discrimination data in response to the bank information signals to generate the output data, wherein the bank data control unit includes a plurality of first logic devices each performing logic AND operation with respect to an inverted signal of corresponding one of the bank information signals and the fetched data provided from corresponding one of the memory banks to generate corresponding one of the bank control data; and the parity data control unit includes a second logic device performing logic AND operation with respect to an inverted signal of the parity information signal and the parity data to provide the parity control data and wherein the refresh operation is independently performed with respect to the respective memory banks, and is prevented from being simultaneously performed with respect to two or more memory banks.

6. The SRAM-compatible memory according to claim 5, wherein the parity bank has a substantially same capacity and structure as each of the memory banks.

7. The SRAM-compatible memory according to claim 5, wherein the memory banks each independently store corresponding one of the input data.

8. The SRAM-compatible memory according to claim 5, wherein each of the memory banks independently performs a read-access operation in response to a read command externally provided.

9. The SRAM-compatible memory according to claim 5, wherein the selecting unit includes a plurality of multiplexers each receiving corresponding one of the bank control data from corresponding one of the first logic devices and the discrimination data from the discriminating unit and selecting the corresponding one of the bank control data or the discrimination data in response to corresponding one of the bank information signals.

10. The SRAM-compatible memory according to claim 9, wherein the multiplexers each select the discrimination data when the corresponding one of the bank information signals indicates that the fetched data is provided from a memory bank subjected to the invalid read-access.

11. The SRAM-compatible memory according to claim 10, wherein the multiplexers each select the corresponding one of the bank control data when the corresponding one of the bank information signals indicates that the fetched data is valid.

12. An SRAM-compatible memory including a plurality of memory banks each having a plurality of DRAM cells arranged in a matrix form defined by rows and columns, the DRAM cells interfacing with an external system which does not provide a separate timing period for performing a refresh operation for the DRAM cells, comprising:

the memory banks for receiving and storing input data externally provided, the memory banks generating bank information signals each indicating whether a corresponding memory bank is subjected to an invalid read-access;

a parity generator for receiving the input data to generate input parity, the input parity being determined based on the input data and a preset parity value;

a parity bank for storing the input parity and generating a parity bank information signal indicating whether the parity bank is subjected to the invalid read-access;

a refresher timer generating a refresh request signal periodically to activate the refresh operation for both the memory banks and the parity bank; and a data corrector receiving the bank information signals and fetched data from the memory banks and generating output data having same value as the input data by correcting data fetched from a memory bank subjected to the invalid read-access if a checked parity value is different from the preset parity value, the checked parity value being obtained using the fetched data provided from the memory banks and parity data fetched from the parity bank, wherein the data corrector comprises:

a bank data control unit for receiving the bank information signals and the fetched data to provide bank control data, any of the bank control data corresponding to fetched data provided from any of the memory banks subjected to the invalid read-access has a first logic value;

a parity data control unit for receiving the parity information signal and the parity data fetched from the parity bank to provide parity control data;

a discriminating unit for receiving the bank control data and the parity control data and providing discrimination data having a second logic value contrary to the first logical value if the fetched parity data is different from the input parity; and a selecting unit for selecting the bank control data or the discrimination data in response to the bank information signals to generate the output data, wherein the selecting unit includes a plurality of multiplexers for providing one of the discrimination data and the bank control data as the output data in response to the bank information signals, and wherein the refresh operation is independently performed with respect to the respective memory banks, and is prevented from being simultaneously performed with respect to two or more memory banks.

13. The SRAM-compatible memory according to claim 12, wherein the parity bank has a substantially same capacity and structure as each of the memory banks.

14. The SRAM-compatible memory according to claim 12, wherein the memory banks each independently store corresponding one of the input data.

15. The SRAM-compatible memory according to claim 12, wherein each of the memory banks independently performs a read-access operation in response to a read command externally provided.

* * * * *